United States Patent
Nagase et al.

(10) Patent No.: US 11,600,773 B2
(45) Date of Patent: Mar. 7, 2023

(54) SELECTOR AND NON-VOLATILE STORAGE DEVICE

(71) Applicant: Kioxia Corporation, Tokyo (JP)

(72) Inventors: Toshihiko Nagase, Saitama Saitama (JP); Daisuke Watanabe, Yokkaichi Mie (JP); Yoshitomo Kobayashi, Mie Mie (JP); Hiroki Tokuhira, Kawasaki Kanagawa (JP); Hiroki Kawai, Inazawa Aichi (JP)

(73) Assignee: KIOXIA CORPORATION, Tokyo (JP)

( * ) Notice: Subject to any disclaimer, the term of this patent is extended or adjusted under 35 U.S.C. 154(b) by 16 days.

(21) Appl. No.: 17/184,871

(22) Filed: Feb. 25, 2021

(65) Prior Publication Data

US 2021/0288252 A1   Sep. 16, 2021

(30) Foreign Application Priority Data

Mar. 16, 2020 (JP) .............................. JP2020-045316

(51) Int. Cl.
*H01L 45/00* (2006.01)
*H01L 27/24* (2006.01)

(52) U.S. Cl.
CPC ........ *H01L 45/144* (2013.01); *H01L 27/2409* (2013.01); *H01L 45/147* (2013.01)

(58) Field of Classification Search
CPC ...................................................... H01L 45/147
See application file for complete search history.

(56) References Cited

U.S. PATENT DOCUMENTS

| | | | |
|---|---|---|---|
| 8,866,119 B2 | 10/2014 | Yamamoto et al. | |
| 10,084,017 B2 | 9/2018 | Ohba et al. | |
| 10,283,707 B2 | 5/2019 | Kamata | |
| 2016/0336378 A1 | 11/2016 | Ohba et al. | |
| 2018/0019391 A1 | 1/2018 | Ohba et al. | |
| 2020/0343446 A1* | 10/2020 | Chiang | H01L 45/146 |
| 2020/0395410 A1* | 12/2020 | Grobis | H01L 45/1608 |
| 2021/0057644 A1* | 2/2021 | Desu | H01L 45/147 |

FOREIGN PATENT DOCUMENTS

| | | |
|---|---|---|
| JP | 5572056 B2 | 8/2014 |
| JP | WO2015-107945 A1 | 3/2017 |
| JP | 2018-067656 A | 4/2018 |
| WO | WO-2016/129306 A1 | 8/2016 |

* cited by examiner

*Primary Examiner* — Mounir S Amer
(74) *Attorney, Agent, or Firm* — Foley & Lardner LLP

(57) ABSTRACT

A selector includes a first electrode, a second electrode, and a selector layer provided between the first electrode and the second electrode and contains $Si_xTe_yN_z$. The x, y, and z of the $Si_xTe_yN_z$ satisfy $0<x\leq35$, $15\leq y\leq50$, and $50<z\leq85$, satisfy $0<x\leq45$, $15\leq y\leq55$, and $40<z\leq85$, or satisfy $0<x\leq55$, $15\leq y\leq65$, and $30<z\leq85$.

18 Claims, 8 Drawing Sheets

SELECTOR AND NON-VOLATILE STORAGE DEVICE

CROSS-REFERENCE TO RELATED APPLICATION

This application is based upon and claims the benefit of priority from Japanese Patent Application No. 2020-045316, filed on Mar. 16, 2020, the entire contents of which are incorporated herein by reference.

FIELD

Embodiments described herein relate generally to selectors and non-volatile storage devices.

BACKGROUND

A device using a plurality of memory cells is known as a non-volatile storage device. Each memory cell includes, for example, a resistive memory element and a selector connected in series with the resistive memory element.

DETAILED DESCRIPTION

Figure 1:
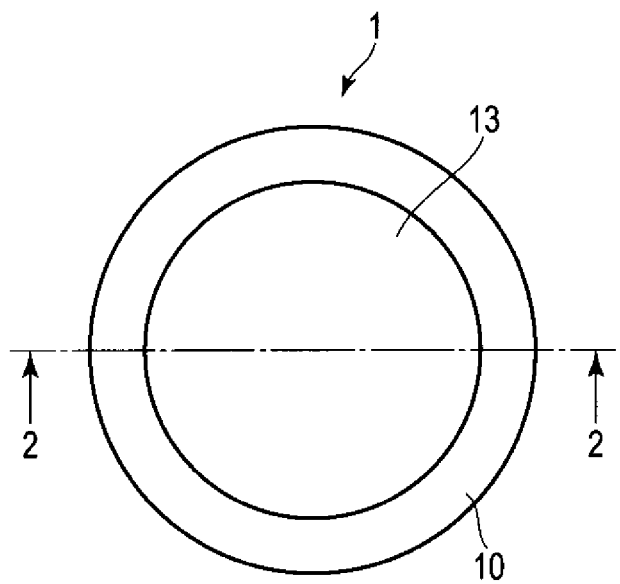
FIG. 1 is a plan view of a selector according to a first embodiment.

At least one embodiment provides a selector and a non-volatile storage device capable of preventing an increase in leakage current.

In general, according to at least one embodiment, there is provided a selector including a first electrode, a second electrode, and a selector layer which is provided between the first electrode and the second electrode and contains $Si_xTe_yN_z$ ($x+y+z\leq100$) or $Si_xTe_yO_wN_z$ ($w+x+y+z\leq100$). The x, y, and z of the $Si_xTe_yN_z$ satisfy $0<x\leq35$, $15\leq y\leq50$, and $50<z\leq85$, satisfy $0<x\leq45$, $15\leq y\leq55$, and $40<z\leq85$, or satisfy $0<x\leq55$, $15\leq y\leq65$, and $30<z\leq85$. The w, x, y, and z of the $Si_xTe_yO_wN_z$ satisfy $0<x\leq35$, $15\leq y\leq50$, and $50<w+z\leq85$, satisfy $0<x\leq45$, $15\leq y\leq55$, and $40<w+z\leq85$, or satisfy $0<x\leq55$, $15\leq y\leq65$, and $30<w+z\leq85$.

A non-volatile storage device according to at least one embodiment includes a first wiring, a second wiring intersecting the first wiring, and a memory cell which is provided corresponding to an intersection of the first wiring and the second wiring. The memory cell includes a selector according to at least one embodiment and a resistive memory element which is electrically connected in series to the selector.

Hereinafter, embodiments will be described with reference to the drawings. The drawings are schematic or conceptual and may not always be the same as the actual ones. In addition, in the drawings, in some cases, the same reference numerals denote the same or corresponding components, and duplicate description may be omitted. In addition, for simplification, even if there are the same or corresponding components, the components may not be denoted by reference numerals.

First Embodiment

Figure 2:
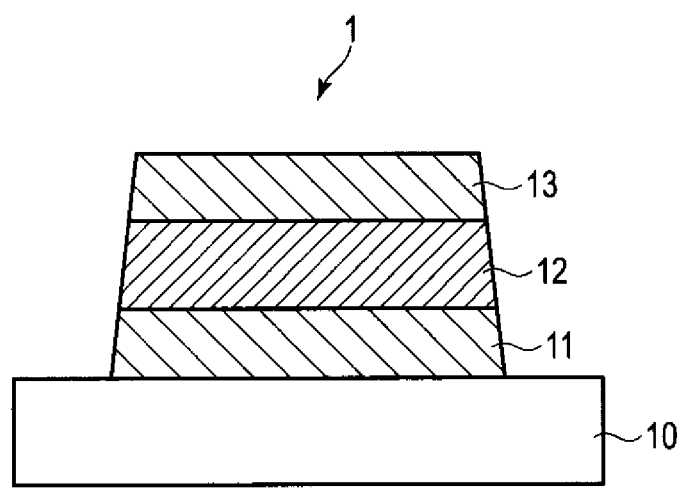
FIG. 2 is a cross-sectional view taken along line 2-2 of FIG. 1.

FIG. 1 is a plan view of a selector 1 according to at least one embodiment. FIG. 2 is a cross-sectional view taken along line 2-2 of FIG. 1.

As illustrated in FIG. 2, the selector 1 includes a first electrode 11, a selector layer 12, and a second electrode 13 provided on a lower region 10. In at least one embodiment, the first electrode 11 and the selector layer 12 are in direct contact with each other. The second electrode 13 and the selector layer 12 are in direct contact with each other.

In at least one embodiment, the selector 1 is, for example, a switch element between two terminals. When the voltage applied between the two terminals is less than a threshold voltage, the switch element is in a "high resistance" state, for example, an electrically non-conducting state. When the voltage applied between the two terminals is equal to or more than the threshold voltage, the switch element changes to a "low resistance" state, for example, an electrically conducting state. Hereinafter, the voltage at which the voltage value is the threshold voltage is referred to as a threshold voltage.

The lower region 10 includes, for example, a semiconductor substrate, transistors, wiring, and an interlayer insulating film.

The first electrode 11 and the second electrode 13 include, for example, a titanium nitride layer. The thickness of the titanium nitride layer is, for example, 5 nm.

The selector layer 12 contains silicon (Si), tellurium (Te), and nitrogen (N) and is represented by $Si_xTe_yN_z$ ($x+y+z\leq100$). The thickness of the selector layer 12 may be, for example, 20 nm.

The inventors have focused on the existence of dangling bond of Te as a condition for applying a voltage to the selector 1 to change the resistance of the selector 1 from a high resistance (off) to a low resistance (on). Dangling bond of Te occur due to Te—Te bond, Te—Si bond, and Te—N bond in the $Si_xTe_yN_z$.

Hereinafter, a ratio of the sum of the number of Te—Te bonds, the number of Te—Si bonds, and the number of Te—N bonds in the $Si_xTe_yN_z$ to the sum of the number of Te—Te bonds, the number of Te—Si bonds, the number of Te—N bonds, the number of Si—Si bonds, the number of Si—N bonds, and the number of N—N bonds in the $Si_xTe_yN_z$, which is expressed as a percentage (%), is called a Te bond ratio.

It is found that, when the Te bond ratio is 20% or more, more preferably more than 50%, there are many dangling bond of Te, and the selector 1 switches. In order to increase the dangling bond of Te in the $Si_xTe_yN_z$, it is effective to add, for example, argon (Ar), antimony (Sb), or arsenic (As) to the $Si_xTe_yN_z$. However, if there are too many dangling bond of Te, the leakage current is increased, and thus, it is preferable that the Te bond ratio does not exceed 70%.

In addition, the inventors examined the relationship between the leakage current and the threshold voltage with respect to a plurality of the selectors 1 having different nitrogen concentrations in the selector layer 12. As a result, there was a correlation between the leakage current and the nitrogen concentration, and the leakage current was smaller as the selector 1 had a higher nitrogen concentration. It is found that, in order to reduce the leakage current, the nitrogen concentration is preferably larger than 30 at %, more preferably larger than 40 at %, and even more preferably larger than 50 at %.

In addition, the inventors examined the relationship between the nitrogen concentration and the threshold voltage with respect to a plurality of the selectors 1 having different nitrogen concentrations in the selector layer 12. As a result, the nitrogen concentration had almost no effect on the threshold voltage, and even if the nitrogen concentration was increased, the threshold voltage was substantially constant, or the increase in the threshold voltage was slight.

Figure 3:
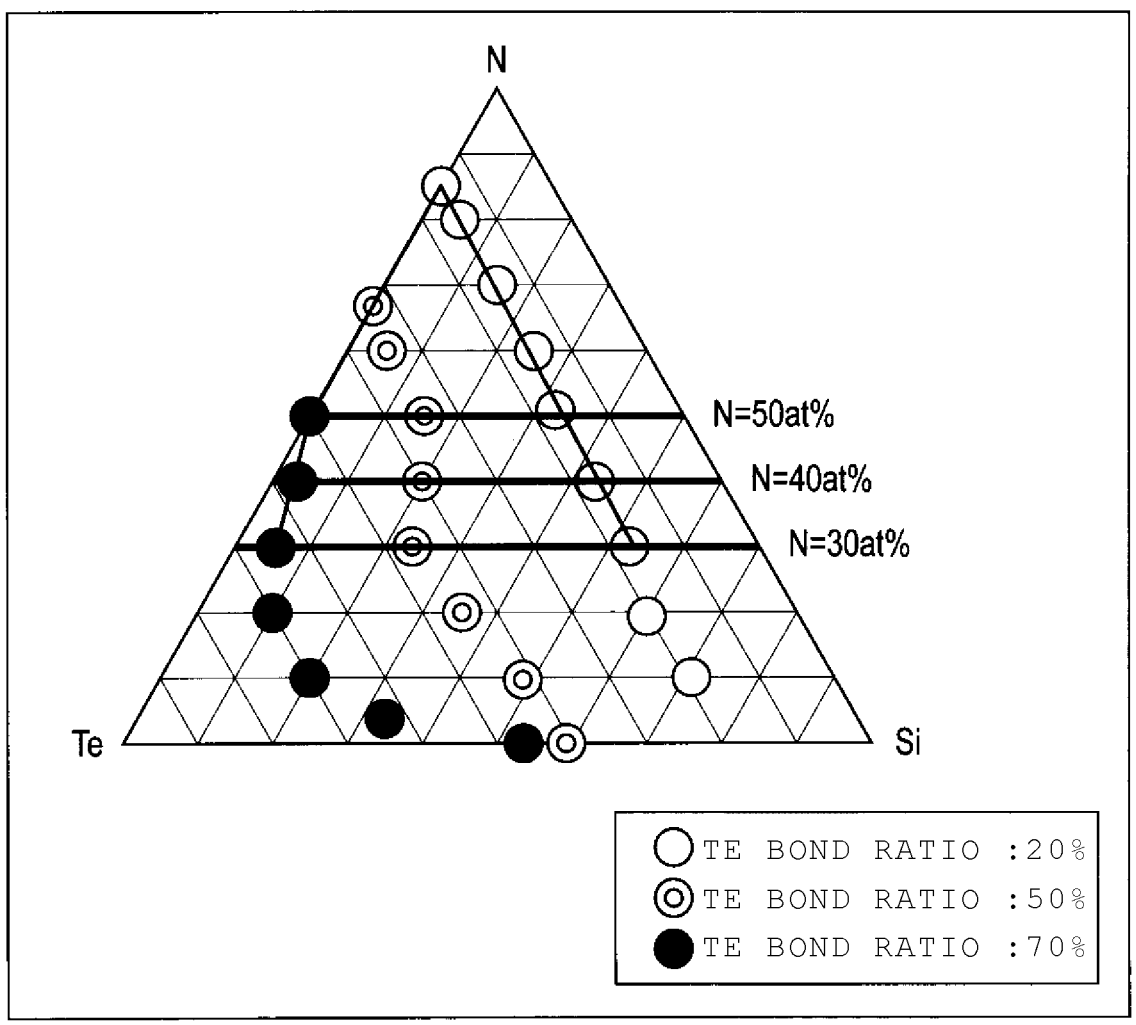
FIG. 3 is a ternary diagram of $Si_xTe_yN_z$.

FIG. 3 is a ternary diagram of the $Si_xTe_yN_z$. In FIG. 3, the Te bond ratio of 20% is indicated by a white circle, the Te bond ratio of 50% is indicated by a double circle, and the Te bond ratio of 70% is indicated by a black circle.

The inventors have found that, when the range of x, y, and z corresponds to any one of the first range, the second range, and the third range below by using FIG. 3, the increase in the threshold voltage can be prevented, and the leakage current of the selector 1 can be reduced.

First range: $0<x\leq35$, $15\leq y\leq50$, and $50<z\leq85$.
Second range: $0<x\leq45$, $15\leq y\leq55$, and $40<z\leq85$.
Third range: $0<x\leq55$, $15\leq y\leq65$, and $30<z\leq85$.

It is advantageous in terms of power saving of the selector 1 that, when the nitrogen concentration of the selector layer 12 is increased in order to reduce the leakage current, the increase of the threshold voltage can be prevented. In at least one embodiment, the threshold voltage is a low voltage of, for example, 2 to 3 [V].

The x, y, and z of $Si_xTe_yN_z$ can be analyzed by using physical analysis such as energy dispersive X-ray spectroscopy (TEMEDX) or electron energy loss spectroscopy (EELS).

It is noted that the inventors examined other materials containing chalcogen elements, for example, BCTeN, and it was confirmed that the threshold voltage of the BCTeN increases as the nitrogen concentration (nitrogen composition ratio) increases. That is, it is considered that the $Si_xTe_yN_z$ has a peculiar property that other materials do not have, that is, a property that the change in the threshold voltage when the nitrogen concentration is increased in order to reduce the leakage current is small.

In at least one embodiment, the selector layer 12 including the $Si_xTe_yN_z$ is used, but the selector layer 12 including $Si_xTe_yO_wN_z$ ($w+x+y+z\leq100$) may be used. It is found that, when the range of w, x, y, and z corresponds to any one of the fourth range, the fifth range, and the sixth range below, while the threshold voltage is maintained substantially constant, or the increase in the threshold voltage is prevented slightly, the leakage current of the selector 1 can be reduced.

Fourth range: $0<x\leq35$, $15\leq y\leq50$, and $50<w+z\leq85$.
Fifth range: $0<x\leq45$, $15\leq y\leq55$, and $40<w+z\leq85$.
Sixth range: $0<x\leq55$, $15\leq y\leq65$, and $30<w+z\leq85$.

Second Embodiment

Figure 4:
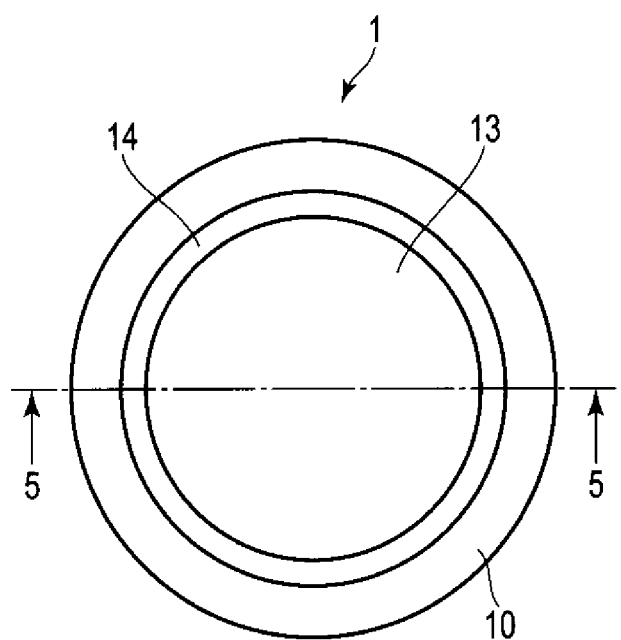
FIG. 4 is a plan view of a selector according to a second embodiment.
Figure 5:
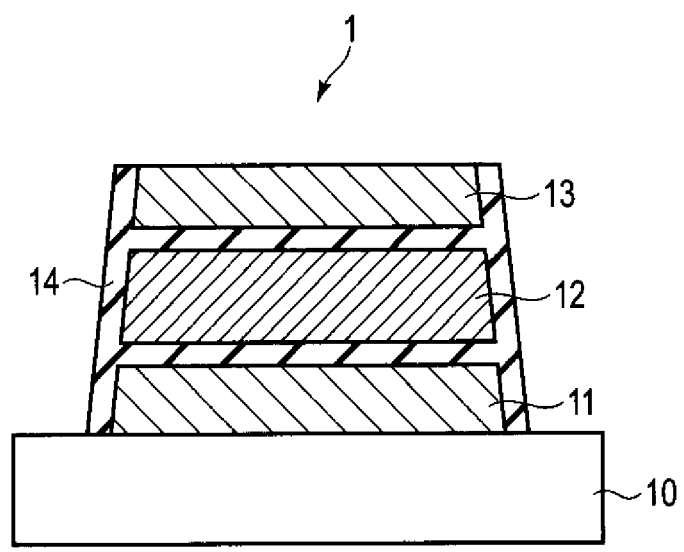
FIG. 5 is a cross-sectional view taken along line 5-5 of FIG. 4.

FIG. 4 is a plan view of a selector 1 according to the embodiment. FIG. 5 is a cross-sectional view taken along line 5-5 of FIG. 4.

As illustrated in FIG. 5, the selector 1 includes a first electrode 11, a selector layer 12, a second electrode 13, and a nitride layer 14 provided on the lower region 10.

The selector layer 12 may contain aluminum (Al), boron (B), or carbon (C) in addition to Si, Te, and N. That is, the selector layer may be a compound in which B or C is added to AlSiTeN. In this case, the total amount of Al, B, and C in the compound is, for example, less than 10 at %. The advantage of adding Al, B, or C is that, in AlN, BN, CN, and the like, the elements constituting the SiTeN are bonded with the added elements, and the threshold voltage and the leakage current can be adjusted.

The selector layer 12 is covered with a nitride layer 14. FIG. 5 illustrates a structure in which the lower surface, the upper surface, and the side surface of the selector layer 1 are covered with the nitride layer 14. It is noted that the side surface of the first electrode 11 and the side surface of the second electrode 13 are also covered with the nitride layer 14, but the side surface of the first electrode 11 and the side surface of the second electrode 13 may be covered with a layer of a material different from that of the nitride layer 14.

In at least one embodiment, the three-dimensional shape of the selector 1 is a truncated cone, as can be seen from FIGS. 1 and 2. The diameter of the second electrode 13 is, for example, 100 nm. The three-dimensional shape of the selector 1 may be another shape. Other shapes are, for example, cylinders, prisms, or pyramids.

The nitride layer 14 contains one compound selected from, for example, aluminum nitride, boron nitride, carbon nitride, gallium nitride, scandium nitride, or silicon nitride.

It is noted that, when an insulating material (for example, aluminum nitride) is used as the nitride of the nitride layer 14, if the thickness of the nitride layer containing the insulating material is allowed to be small (for example, several nm), the resistance of the nitride layer can be allowed to be sufficiently lower than the off-resistance of the selector layer 12.

In addition, in order to adjust the resistance of the nitride layer 14, elements such as titanium (Ti), zirconium (Zr), hafnium (Hf), vanadium (V), niobium (Nb), tantalum (Ta), chromium (Cr), or molybdenum (Mo) may be added to the nitride layer 14.

If the nitrogen concentration in the selector layer 12 is decreased, the leakage current is increased. However, in at least one embodiment, since the surface of the selector layer 12 is covered with the nitride layer 14, fluctuations in the nitrogen concentration in the selector layer 12 can be prevented. As a result, the increase in leakage current due to the decrease in the nitrogen concentration can be prevented.

If nitrogen is preferentially diffused to the outside from any surface of the lower surface, the upper surface, and the side surface of the selector layer 12, there is a possibility that a variation in the nitrogen distribution in the selector layer 12 may occur. If the variation in the nitrogen distribution occurs, there is a possibility that the leakage current may occur in the region where the nitrogen concentration is low. For this reason, it is preferable that the lower surface, the upper surface, and the side surface of the selector layer 12 are covered with the nitride layer 4 of the same material.

Figure 6:
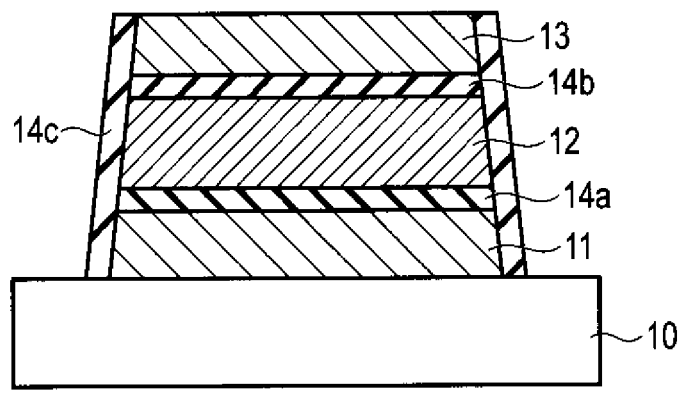
FIG. 6 is a cross-sectional view illustrating a modified example of the selector according to the second embodiment.

It is noted that, when the above-mentioned leakage current does not matter, as illustrated in, for example, FIG. 6, the lower surface, the upper surface, and the side surface of the selector layer 12 may be covered with nitride layers 14a, 14b, and 14c, respectively. It is noted that the three nitride layers 14a, 14b, and 14c may be made of different materials, or two of the three nitride layers may be made of the same material. For example, the nitride layers 14a and 14b may be made of the same material.

Hereinafter, an example of a manufacturing method of the selector 1 will be described.

Figure 7:
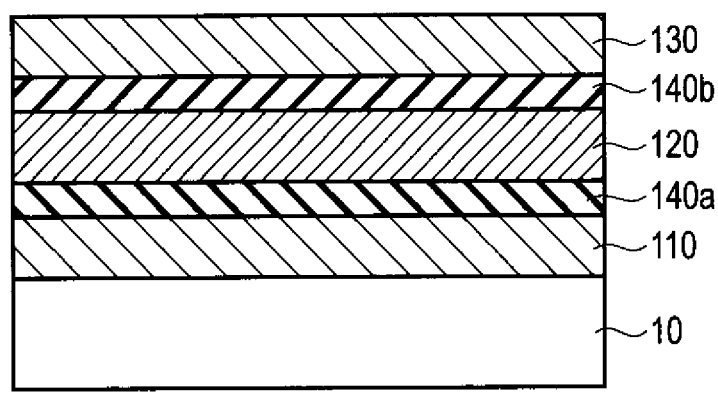
FIG. 7 is a cross-sectional view illustrating an example of a manufacturing method of a selector according to the second embodiment.

First, as illustrated in FIG. 7, a conductive layer 110, a nitride layer 140a, a SiTeN layer 120, a nitride layer 140b, and a conductive layer 130 are sequentially formed on the lower region 10.

The conductive layer 110 becomes the lower electrode 11. The nitride layer 140a becomes the nitride layer that covers the lower surface of the selector layer 12. The SiTeN layer 120 becomes the selector layer 12. The nitride layer 140b becomes the nitride layer that covers the upper surface of the selector layer. The conductive layer 130 becomes the upper electrode 13.

Figure 8:
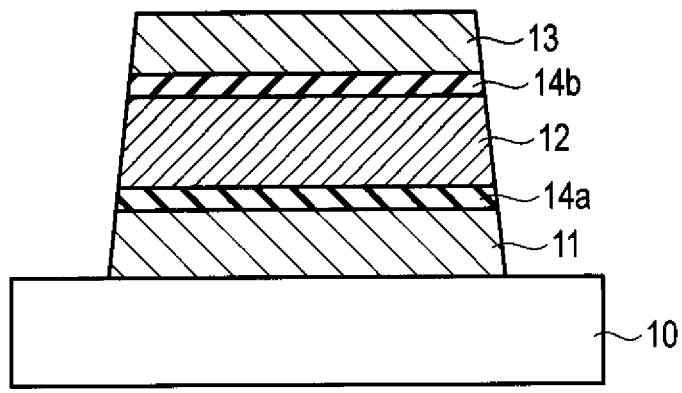
FIG. 8 is a cross-sectional view illustrating an example of a manufacturing method of a selector according to the second embodiment.

Next, by processing a stacked body of the conductive layer 110, the nitride layer 140a, the SiTeN layer 120, the nitride layer 140b, and the conductive layer 130 by using a photolithography process and an etching process, as illustrated in FIG. 8, the first electrode 11, the nitride layer 14a, the selector layer 12, and the nitride layer 14b are formed.

Figure 9:
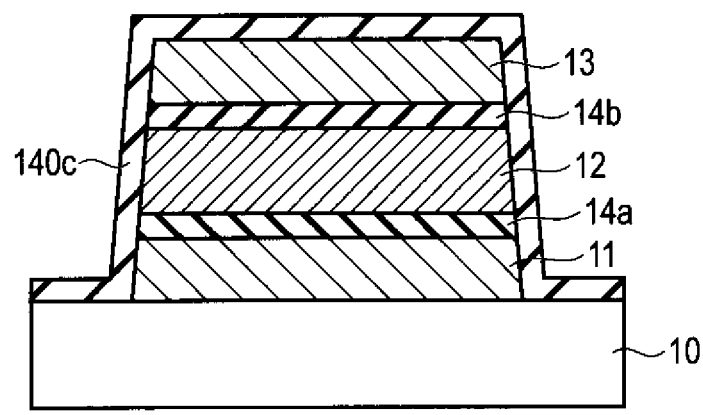
FIG. 9 is a cross-sectional view illustrating an example of a manufacturing method of a selector according to the second embodiment.

Next, as illustrated in FIG. 9, a nitride layer 140c is formed so as to cover the surface of the lower region 10, the side surface of the first electrode 11, the side surface of the nitride layer 14a, the side surface of the selector layer 12, the side surface of the nitride layer 14b, the side surface of the second electrode 13, and the upper surface of the second electrode 13. The nitride layer 140c becomes the nitride layer that covers the side surface of the selector layer 12.

After that, by using etchback to remove the nitride layer 140c on the surface of the lower region 10 and the nitride layer 140c on the upper surface of the second electrode 13, the selector 1 illustrated in FIG. 5 is obtained.

When the manufacturing method described above is used, the nitride layer 14 of FIG. 5 is configured with the nitride layer 14a, the nitride layer 14b, and the nitride layer 140c remaining after etching back.

Third Embodiment

Figure 10:
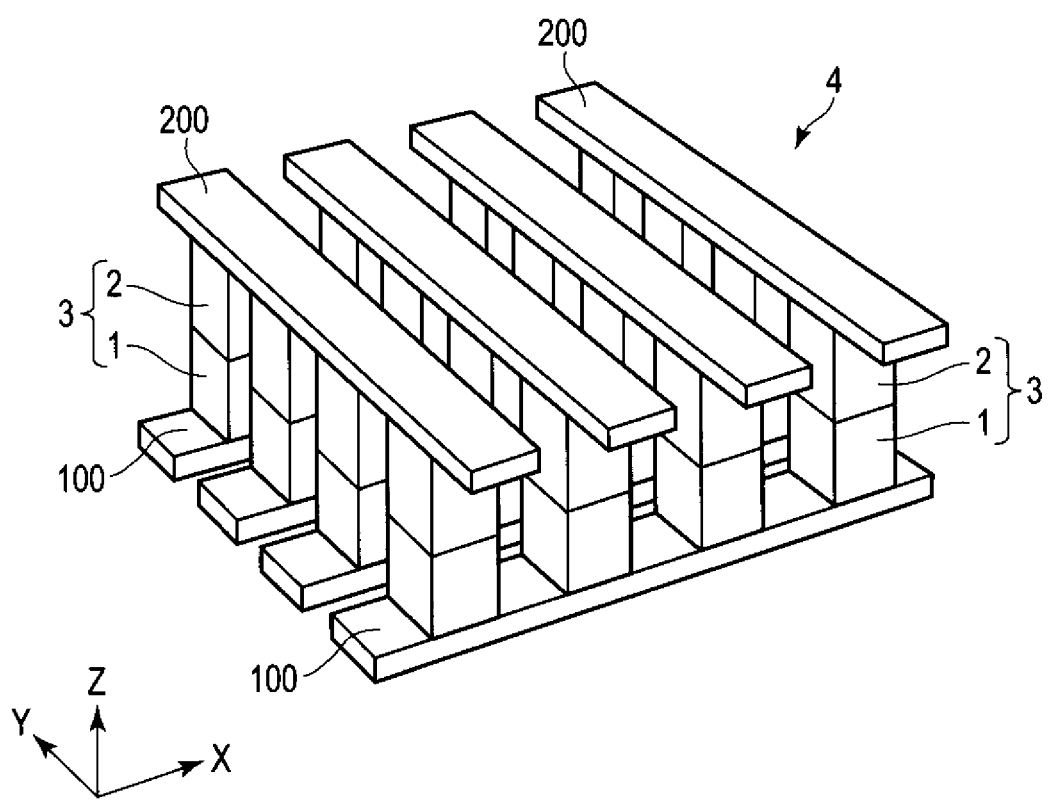
FIG. 10 is a perspective view of a non-volatile storage device according to a third embodiment.

FIG. 10 is a perspective view of a non-volatile storage device 4 according to at least one embodiment. In FIG. 10, X, Y, and Z indicate three axes of which directions are different from each other.

The non-volatile storage device 4 includes a plurality of first wirings 100, a plurality of second wirings 200, and a plurality of memory cells 3 corresponding to intersections of the first wirings 100 and the second wirings 200.

The plurality of first wirings 100 extend along the X axis and are arranged at a predetermined interval along the Y axis. The plurality of second wirings 200 extend along the Y axis and are arranged at a predetermined interval along the X axis. The first wiring 100 and the second wiring 200 intersect each other. In at least one embodiment, the first wiring 100 and the second wiring 200 are perpendicular to each other. One of the first wiring 100 and the second wiring 200 corresponds to a word line, and the other of the first wiring 100 and the second wiring 200 corresponds to a bit line.

The memory cell 3 includes a selector 1 and a resistive memory element 2. The selector 1 and the resistive memory element 2 are electrically connected in series. The selector 1 and the resistive memory element 2 are sequentially provided along the Z axis. In FIG. 10, although the resistive memory element 2 is provided on the selector 1, the selector 1 may be provided on the resistive memory element 2.

The resistive memory element 2 is, for example, a magnetoresistive effect element. A non-volatile storage device using a magnetoresistive effect element is referred to as a magnetic random access memory (MRAM).

Figure 11:
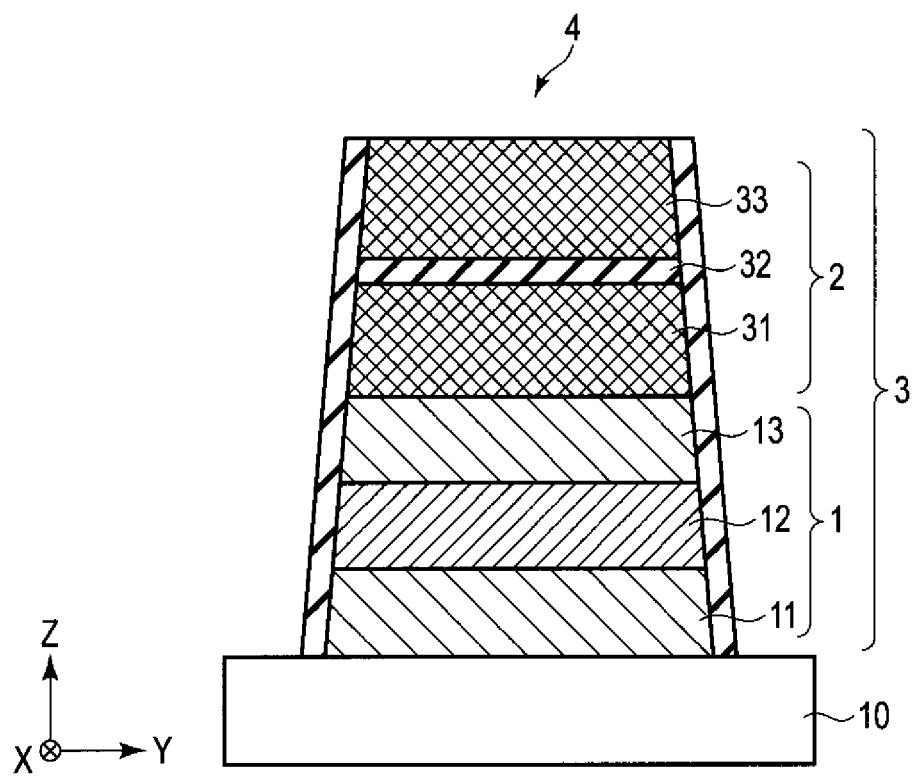
FIG. 11 is a cross-sectional view illustrating an example of a memory cell according to the third embodiment.

FIG. 11 is a cross-sectional view of the memory cell 3 when a magnetoresistive effect element is used as the resistive memory element 2. In FIG. 11, the selector 1 (FIG. 2) according to the first embodiment is used. The lower region 10 of FIG. 11 includes the first wiring 100 of FIG. 10.

As illustrated in FIG. 11, the magnetoresistive effect element which is the resistive memory element 2 includes a storage layer 31, a tunnel barrier layer 32, and a reference layer 33. The storage layer 31, the tunnel barrier layer 32, and the reference layer 33 are stacked in this order along the Z axis. In FIG. 11, although the storage layer 31 is provided below the tunnel barrier layer 32 and the reference layer 33 is provided above the tunnel barrier layer 32, the reference layer 33 may be provided below the tunnel barrier layer 32 and the storage layer 31 may be provided above the tunnel barrier layer 32.

The storage layer 31 has a variable magnetization direction. The variable magnetization direction denotes that the magnetization direction changes with respect to a predetermined write current. The storage layer 31 contains, for example, iron (Fe), cobalt (Co), and boron (B).

The reference layer 33 has a fixed magnetization direction. The fixed magnetization direction denotes that the magnetization direction does not change with respect to a predetermined write current. The reference layer 33 contains, for example, Fe and CoB.

The tunnel barrier layer 32 is an insulating layer provided between the storage layer 31 and the reference layer 33. This insulating layer contains, for example, magnesium (Mg), and oxygen (O).

The magnetoresistive effect element is, for example, a spin transfer torque (STT) type magnetoresistive effect element. In this case, the magnetization direction of the storage layer 31 is the direction perpendicular to the main surface, and the magnetization direction of the reference layer 33 is the direction perpendicular to the main surface.

The magnetoresistive effect element has a low resistance state in which the magnetization direction of the storage layer 31 is parallel to the magnetization direction of the reference layer 33 and a high resistance state in which the magnetization direction of the storage layer 31 is antiparallel to the magnetization direction of the reference layer 33. Therefore, the magnetoresistive effect element can store binary data (0 or 1) according to the resistance state (low resistance state or high resistance state). In addition, the low resistance state or the high resistance state is set in the magnetoresistive effect element according to the direction of the current flowing through the magnetoresistive effect element.

It is noted that a variable resistance film may be used as the resistive memory element 2. This variable resistance film contains, for example, GeSbTe as a material. A non-volatile storage device using the variable resistance film containing such a material is referred to as a phase change memory (PCM). In addition, a variable resistance film containing a super lattice in which GeTe and SbTe are stacked may be used. A non-volatile storage device using such a variable resistance film including a super lattice is referred to as an interfacial phase change memory (iPCM).

Figure 12:
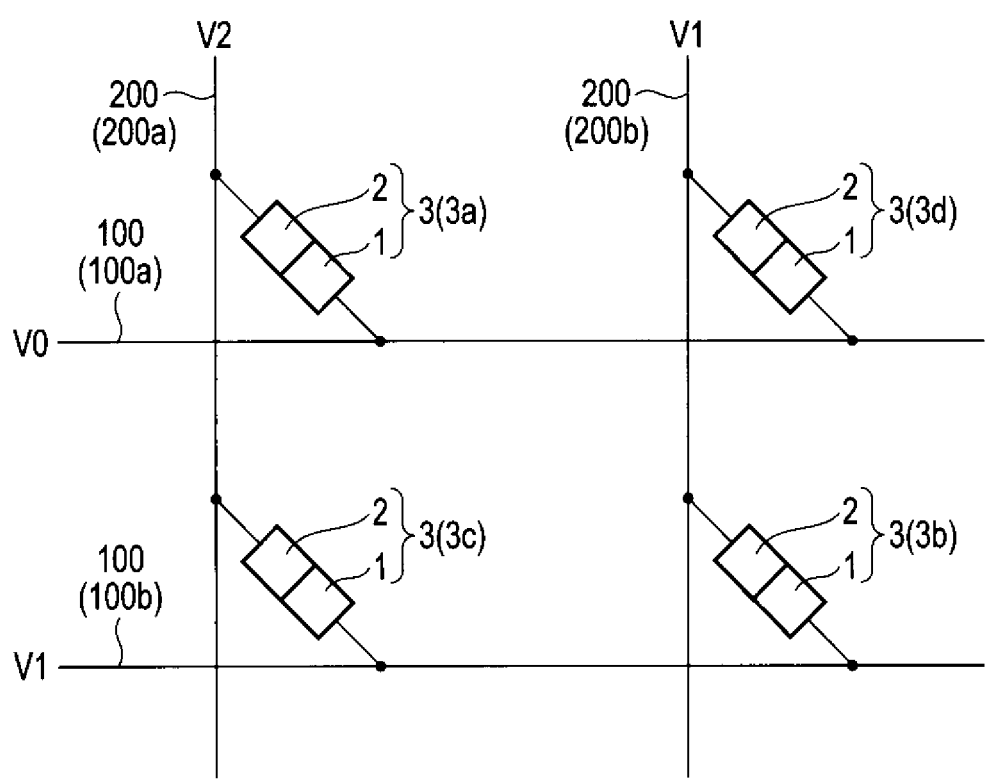
FIG. 12 is a diagram illustrating voltages applied to a plurality of memory cells during reading data.

FIG. 12 is a diagram illustrating voltages applied to the plurality of memory cells 3 during reading data.

FIG. 12 illustrates, for simplification, only four memory cells 3 (3a to 3d), two first wirings 100 (100a and 100b), and two second wirings 200 (200a and 200b).

During reading data stored in the upper left memory cell 3a, for example, a voltage V0 is applied to the first wiring 100a, a voltage V1 is applied to the first wiring 100b, and a voltage V2 is applied to the second wiring 200a, and a voltage V1 is applied to the second wiring 200b.

The voltages V0, V1, and V2 are supplied from a power supply circuit (not illustrated) in the non-volatile storage device. The magnitude relationship between the voltages V0, V1, and V2 is V0<V1<V2. The voltage (V2−V0) is selected so that the voltage applied to the selector 1 is higher than the threshold voltage of the selector 1.

When such voltages V0, V1, and V2 are applied, the voltage (V2−V0) is applied to the memory cell 3a, and thus, the memory cell 3a enters the selected state. For this reason, it is possible to read the data stored in the memory cell 3a based on the resistance state of the resistive memory element 2.

Since no voltage (V1−V1=0) is applied to the memory cell 3b, the memory cell 3b enters the non-selected state. For this reason, the leakage current of the memory cell 3d is sufficiently small.

The voltage (V2−V1) is applied to the memory cell 3c and the voltage (V1−V0) is applied to the memory cell 3d, and the memory cells 3c and 3d enter the semi-selected state. However, since the selector 1 according to the embodiment has an effect of preventing an increase in leakage current, it is possible to prevent an increase in leakage current of the memory cells 3c and 3d.

Figure 13:
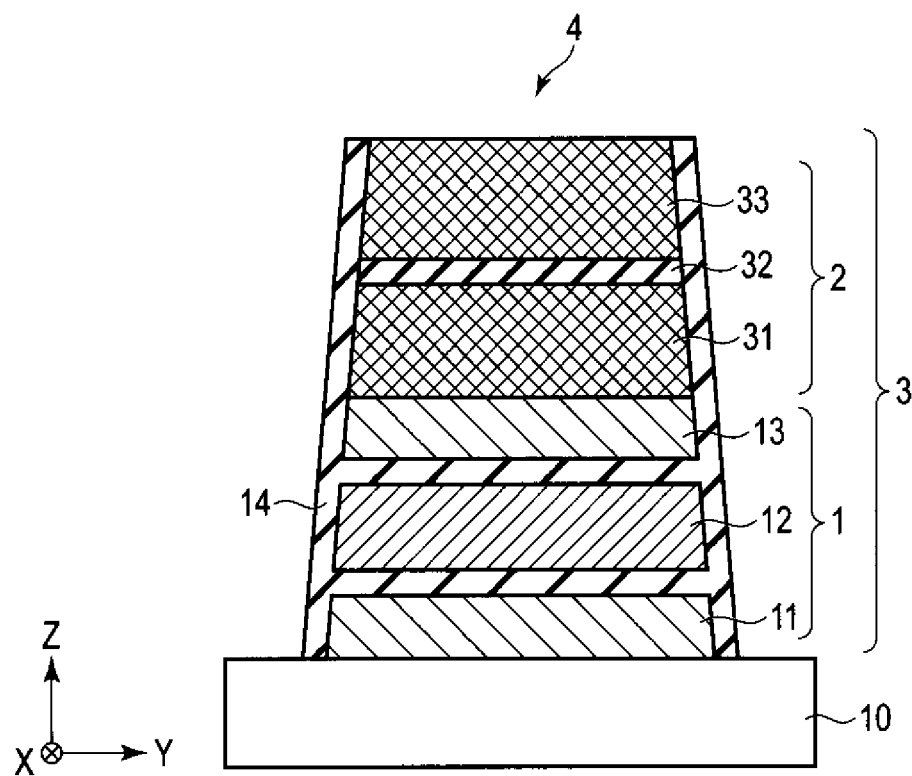
FIG. 13 is a cross-sectional view illustrating a modified example of the memory cell according to the third embodiment.

FIG. 13 is a cross-sectional view illustrating a modified example of the memory cell 3. In this modified example, the selector 1 according to the second embodiment is used.

Figure 14:
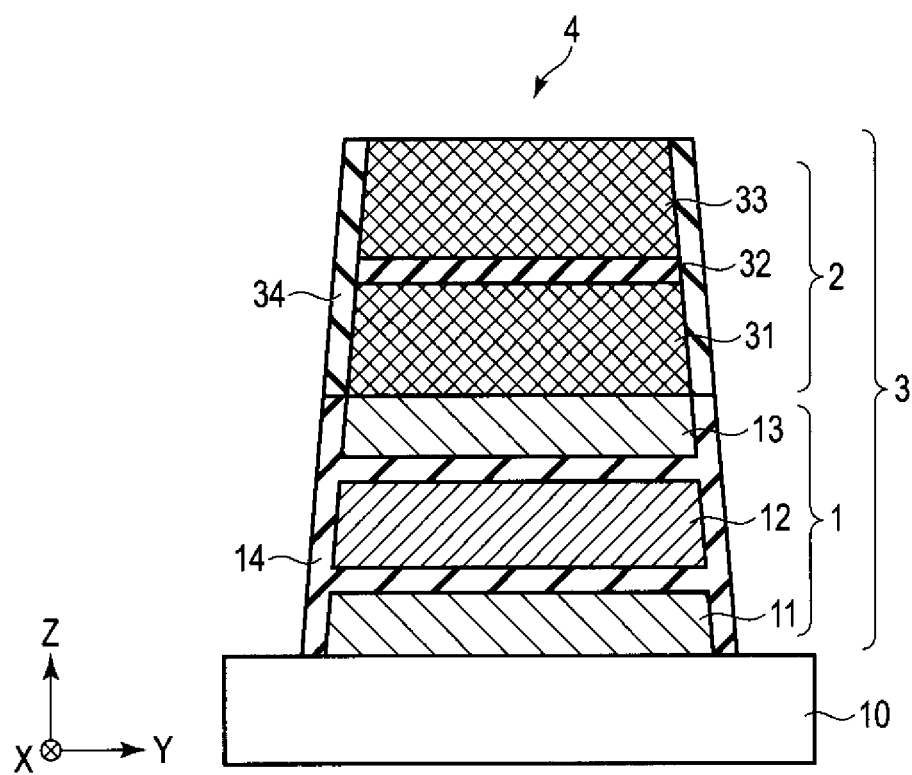
FIG. 14 is a cross-sectional view illustrating another modified example of the memory cell according to the third embodiment.

FIG. 14 is a cross-sectional view illustrating another modified example of the memory cell 3. In this modified example, the material of the nitride layer 14 provided on the side surface of the selector 1 is different from the material of the nitride layer 34 provided on the side surface of the magnetoresistive effect element.

Figure 15:
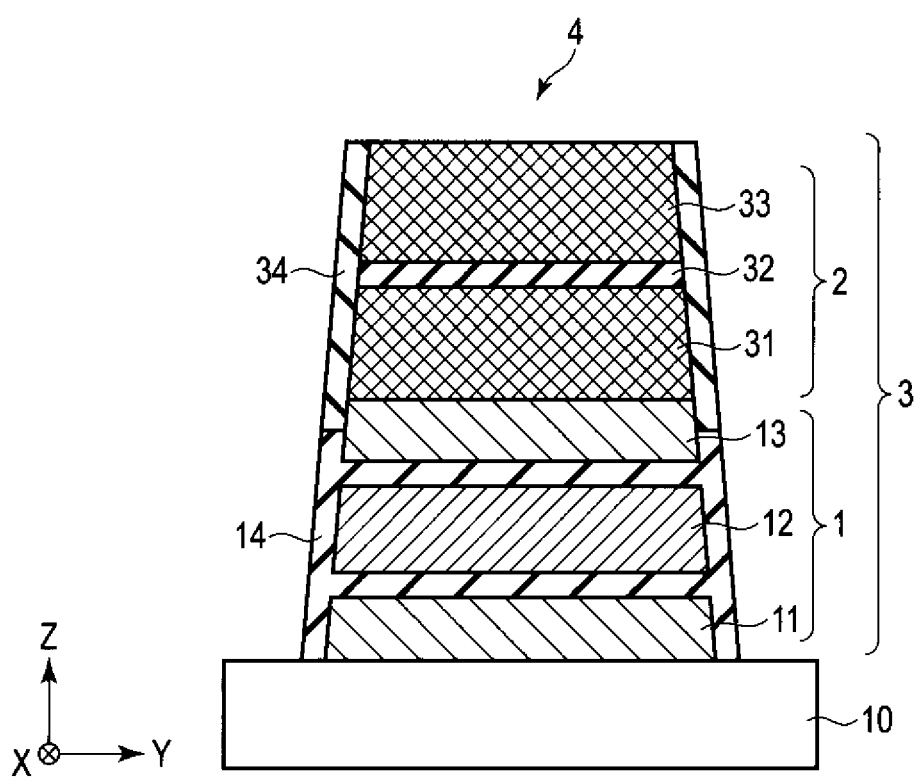
FIG. 15 is a cross-sectional view illustrating still another modified example of the memory cell according to the third embodiment.

FIG. 15 is a cross-sectional view illustrating still another modified example of the memory cell 3. In this modified example, the nitride layer 34 is also provided on the upper side surface of the second electrode 13 of the selector 1.

It is noted that in at least one embodiment, the side surface of the selector 1 is covered with the nitride layer 14, but the lower surface of the selector 1 and the upper surface of the selector 1 are not covered with the nitride layer. However, as in the first or second embodiment, the lower surface, upper surface, and side surface of the selector 1 may be covered with the nitride layer.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A selector comprising:
a first electrode;
a second electrode; and
a selector layer provided between the first electrode and the second electrode, the selector layer containing $Si_xTe_yN_z$ (x+y+z≤100) or $Si_xTe_yO_wN_z$ (w+x+y+z≤100),
wherein the x, y, and z of the $Si_xTe_yN_z$ satisfy the following:
0<x≤35, 15≤y≤50, and 50<z≤85,
0<x≤45, 15≤y≤55, and 40<z≤85, or
0<x≤55, 15≤y≤65, and 30<z≤85, and
wherein the w, x, y, z of the $Si_xTe_yO_wN_z$ satisfy the following:
0<x≤35, 15≤y≤50, and 50<w+z≤85,
0<x≤45, 15≤y≤55, and 40<w+z≤85, or
0<x≤55, 15≤y≤65, and 30<w+z≤85,
wherein the selector layer contains $Si_xTe_yN_z$, and the $Si_xTe_yN_z$ has a Te bond ratio, the Te bond ratio being a ratio of the sum of the number of Te—Te bonds, the number of Te—Si bonds, and the number of Te—N bonds in the $Si_xTe_yN_z$ to the sum of the number of Te—Te bonds, the number of Te—Si bonds, the number of Te—N bonds, the number of Si—Si bonds, the number of Si—N bonds, and the number of N—N bonds in the $Si_xTe_yN_z$, wherein the Te bond ratio is 20% or more,
wherein the Te bond ratio does not exceed 70%.

2. The selector according to claim 1, wherein the selector is a switch element.

3. The selector according to claim 1, wherein the Te bond ratio is 50% or more.

4. The selector according to claim 1, wherein the first electrode and the selector layer are in direct contact with each other.

5. The selector according to claim 1, wherein the second electrode and the selector layer are in direct contact with each other.

6. The selector according to claim 4, wherein the second electrode and the selector layer are in direct contact with each other.

7. The selector according to claim 1, wherein the selector layer includes Ar, Sb, or As.

8. A selector comprising:
a first electrode;
a second electrode;
a selector layer provided between the first electrode and the second electrode, the selector layer containing Si, Te, and N, the selector layer having a top surface facing the first electrode, a bottom surface facing the second electrode, and at least one side surface between the top surface and the bottom surface; and
a nitride layer provided between the first electrode and the selector layer, between the second electrode and the selector layer, and on an entirety of the at least one side surface of the selector layer.

9. The selector according to claim 8, wherein the selector layer includes at least one of Al, B, or C.

10. The selector according to claim 9, wherein the selector layer includes at least one of Al, B, or C in a total amount of less than 10 at percent.

11. The selector according to claim 8, wherein the nitride layer contains at least one compound selected from aluminum nitride, boron nitride, carbon nitride, gallium nitride, scandium nitride, or silicon nitride.

12. The selector according to claim 8, wherein the nitride layer is formed from a same material throughout its thickness.

13. The selector according to claim 8, wherein the nitride layer includes at least two sublayers made of different materials.

14. A non-volatile storage device comprising:
a first wiring;
a second wiring intersecting the first wiring; and
a memory cell provided corresponding to an intersection of the first wiring and the second wiring,
wherein the memory cell includes the selector according to claim 1 and a resistive memory element electrically connected in series to the selector.

15. The non-volatile storage device according to claim 14, wherein one of the selector or the resistive memory element is connected to the first wiring, and
wherein the other of the selector or the resistive memory element is connected to the second wiring.

16. The non-volatile storage device according to claim 14, wherein the resistive memory element includes a magnetoresistive effect element or a variable resistance film.

17. The non-volatile storage device according to claim 14, wherein the resistive memory element includes a storage layer.

18. The non-volatile storage device according to claim 17, wherein the resistive memory element includes a tunnel barrier layer on the storage layer.

* * * * *